(12) United States Patent  
Dueweke

(10) Patent No.: US 6,465,732 B1  
(45) Date of Patent: Oct. 15, 2002

(54) LASER FORMATION OF A METAL CAPACITOR AND INTEGRATED COAXIAL LINE

(76) Inventor: Michael Dueweke, 1730 Halford #345, Santa Clara, CA (US) 95051

( * ) Notice: Subject to any disclaimer, the term of this patent is extended or adjusted under 35 U.S.C. 154(b) by 0 days.

(21) Appl. No.: 09/792,021

(22) Filed: Feb. 23, 2001

(51) Int. Cl.$^7$ .............................. H01B 11/06; H01B 7/29
(52) U.S. Cl. ................ 174/36; 29/828; 174/72 C; 174/117 FF; 174/102 R; 361/328; 333/243; 333/12
(58) Field of Search ................... 174/36, 35 R, 174/72 C, 102 R, 117 FF; 361/816, 818, 301.3, 328; 29/828; 333/243, 12

(56) References Cited

U.S. PATENT DOCUMENTS

| | | |
|---|---|---|
| 4,810,663 A | 3/1989 | Raffel et al. |
| 4,845,311 A * | 7/1989 | Schreiber et al. .............. 174/36 |
| 5,585,602 A | 12/1996 | Bernstein |
| 5,861,325 A | 1/1999 | Bernstein |
| 5,920,789 A | 7/1999 | Bernstein |
| 5,940,727 A | 8/1999 | Bernstein |
| 6,156,645 A | 12/2000 | Geha et al. |

* cited by examiner

Primary Examiner—Hung V. Ngo  
(74) Attorney, Agent, or Firm—Piper Rudnick LLP; Steven B. Kelber

(57) ABSTRACT

A method and device for forming metal capacitor and integrated coaxial lines using energy transfer so as to form conductive links among conductors. Conductors are embedded within nonconductive layers, such that the conductors form a matrix of at least three levels. A source of energy is directed at the layers, such that at least one conductor is wholly shielded by at least one other conductor, and conductive paths form so that a conductor becomes shielded by the paths. Particular conductive path formation is encouraged by use of: differing surface areas of conductors; diffusion barriers to increase relative energy absorption; varied relative distances among conductors; some conductors having a lower melting point than other conductors; directing the energy to conductors in a particular order; or combinations thereof. In one variation, links among differing layers are formed using more than one energy source or sequentially generated and directed pulses of energy.

25 Claims, 7 Drawing Sheets

LASER FORMATION OF A METAL CAPACITOR AND INTEGRATED COAXIAL LINE

BACKGROUND OF THE INVENTION

1. Field of the Invention

The invention relates to formation of metal capacitors and integrated coaxial lines using a directed source of energy, and in particular to a method and device for forming metal capacitors and integrated coaxial lines using laser or other energy transfer so as to cause conductive links between metals.

2. Background of the Technology

It is known in the art to form interconnecting conductive links between adjacent or closely situated conductive materials, such as for forming conductive paths within nonconductive environments or to produce conductive paths in integrated circuits for a single layer or level.

In forming such conductive paths, it is known to embed metals in nonconductive material and then to apply directed laser pulses at the metals. The metals absorb the pulsed energy and expand, fracturing the nonconductive material and generally forming fracture paths between each of the two most closely situated metals. As the metals absorb further energy, the metals melt or otherwise expand into the fracture areas, so that conductive links form between the closely situated metals. It is known in the prior art to use such methods to form conductive connections within up to two levels of metals. However, it is not known to use conductive paths to form enclosing paths among three or more levels, such as for use in forming integrated coaxial lines or metal capacitors.

SUMMARY OF THE INVENTION

The present invention includes a method and device for forming metal capacitor and integrated coaxial lines using laser pulses or other energy transfer so as to cause conductive links between metals among three or more levels, including connected paths enclosing lines within the paths. In one embodiment, metals or other conductors are embedded within nonconductive layers, such that the conductors form a matrix of three levels, each of the levels being separated by nonconductive material, and, within each level, conductors being separated from each other by nonconductive material. In one embodiment, a source of energy is directed at the conductive and nonconductive material, such that at least one conductor is wholly shielded by at least one other conductor, and such that some conductors are partially shielded. Upon absorbing energy, the conductors in this embodiment form conductive paths sequentially among layers, such that closed paths form about at least one shielded conductor. Sequential conductive path formation is encouraged using several methods, such as by 1) exposing differing surface areas of conductors to the directed energy, 2) using diffusion barriers to increase energy absorption, 3) varying relative distances between conductors, 4) employing a metal or other conducting substance having a lower melting point for some of the conductors to encourage formation of links with these conductors first, 5) directing the energy, such as in pulses, so that the energy is transmitted at or to conductors in a particular order or in selected patterns, and 6) combinations of these methods.

In another embodiment, links among differing layers are formed using more than one energy source or sequentially generated and directed pulses of energy.

To achieve the stated and other advantages of the present invention, as embodied and described below, the invention includes method for forming a shielded conducting structure, comprising: directing at least one directable source of energy at a plurality of components, the plurality of components including at least a first layer, a second layer, and a third layer, wherein each of the layers includes conducting and nonconducting portions, wherein at least one of the conducting portions in at least one of the layers is shielded from the at least one directable source of energy by at least a second conducting portion in at least one of the layers when the at least one directable source of energy is directed at the plurality of components, and wherein the at least one directable source of energy is directed so as to impinge the layers sequentially; at least one of the conducting portions in the third layer expandably forming first conductive paths with at least two of the conducting portions in the second layer upon the at least one directable source of energy being directed therat; and the at least two of the conducting portions in the second layer expandably forming second conductive paths to the at least one of the conducting portions in the first layer upon the at least one directable source of energy being directed therat; wherein the first and second conductive paths enclosably surround the at least one shielded conducting portion.

To achieve the stated and other advantages of the present invention, as embodied and described below, the invention further includes a device for forming a shielded conducting structure, comprising: a directed source of energy; a first layer positionable for first receiving the directed source of energy, the first layer having a first layer conducting component and two first layer nonconductive regions adjacent the conducting component; a second layer separated from the first layer by a nonconducting region, the second layer including three conducting components separated by two nonconductive regions, wherein the three conducting components of the second layer include a second layer first conducting component, a second layer second conducting component, and a second layer third conducting component, wherein the second layer second conducting component is located between the second layer first conducting component and the second layer third conducting component, wherein the second layer second conducting component is shielded from the source of energy by the first layer conducting component, and wherein the second layer first conducting component and the second layer third conducting component are at least partially unshielded from the source of energy; and a third layer separated from the second layer by a nonconducting region, the third layer including a third layer conducting component at least partially unshielded from the source of energy, the third layer conducting component extending such that the third layer conducting component is impactable by the source of energy via both of the two nonconducting regions of the second layer.

Additional advantages and novel features of the invention will be set forth in part in the description that follows, and in part will become more apparent to those skilled in the art upon examination of the following or upon learning by practice of the invention.

DETAILED DESCRIPTION

Figure 1:
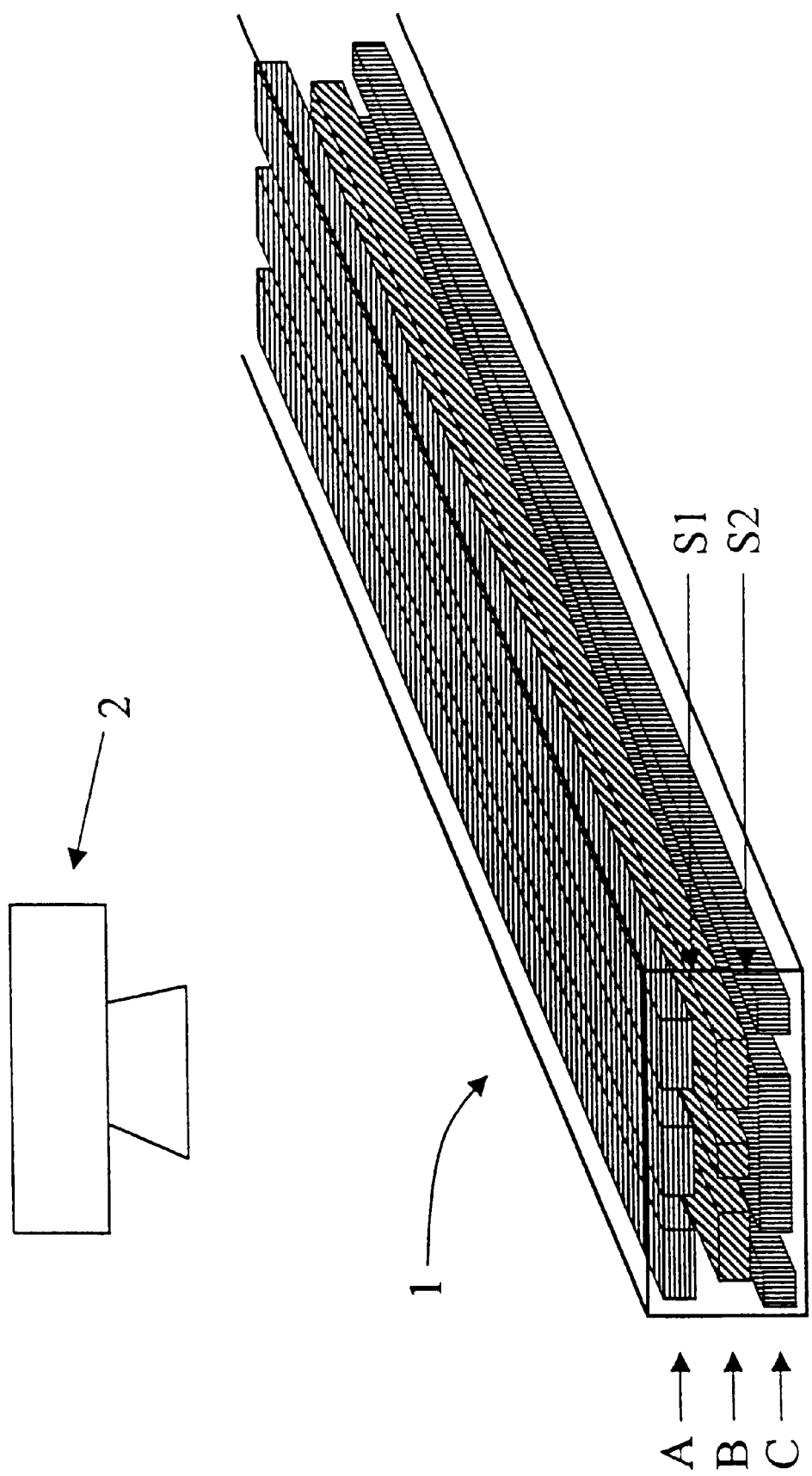
FIG. 1 is a perspective view of components for formation of a coaxial cable or metal capacitor prior to application of energy, such as pulsed laser, in accordance with an embodiment of the present invention.

Embodiments of the present invention include methods and systems for forming an integrated coaxial line or metal capacitor using energy transfer, such as laser pulses, to form metal conductive links or "shorts" between lines. In one embodiment of the present invention, the result of these formed conductive links is the formation of an electromagnetic shield for a signal line within the shield for coaxial line formation. Similarly, a capacitor is formable between the formed shield and the internal line.

In one embodiment, the device includes three or more layers of metal or other conductive material, with a dielectric or other nonconductive material between the layers. Openings in the metals between the layers are designed so as to allow passage of the energy transmitted, such as laser pulses, only to areas to be joined. In one embodiment, the energy transmission is applied in, for example, a single direction so as to begin to melt or otherwise join metals at successive layers through selected openings. In another embodiment, the energy transmission is applied in two directions so as to join conductors in different locations.

In addition, so as to allow selective and successive joining of the layers, from a first layer closest to the energy source, to a second layer, to a third layer farthest from the energy source, the second layer being between the energy source and the third layer, several techniques or methods are used. These techniques include the following: 1) a larger relative area of a third metal layer is exposed to laser irradiation or other energy transfer than that of a second layer; 2) a diffusion barrier or other substance is located between one or more of the layers and the energy source to reduce the amount of reflected energy and allow more relative heat absorption; 3) a shorter relative distance between the third conductive layer and the second conductive layer compared to the distance between the second conductive layer and the first conductive layer, enabling sufficient energy to melt or otherwise cause formation of conductive links between the third and second layers prior to formation of links between the second and first layers; 4) employing a metal or other conducting substance having a lower melting point for some of the conductors to encourage formation of links with these conductors first, 5) directing the energy, such as in pulses, so that the energy is transmitted at or to conductors in a particular order or in selected patterns, and 6) combinations of these methods.

Another method for allowing such successive and selective formation of links is to provide for the third conductive layer to have a lower melting point than the second conductive layer.

In one embodiment, between the layers a continuous, shielded internal line is provided by locating this line such that no transferred energy can cause conductive lines or melting to occur. For example, nonconductive layers may be placed between the line to be shielded and the energy source during irradiation.

The resulting produced coaxial cable or other device thus provides an electrostatic shield for improved signal integrity and reduced crosstalk. For example, the cable or other device produced is usable to protect and isolate critical signal lines from high frequency switching noise.

The present invention also provides an improvement over the prior art by requiring fewer process steps than traditional complementary metal-oxide-silicon (CMOS) processing.

References will now be made in detail to embodiments of the present invention, examples of which are illustrated in the accompanying drawings.

FIG. 1 is a perspective view of components for formation of a coaxial cable or metal capacitor prior to application of energy, such as pulsed laser, in accordance with an embodiment of the present invention. As shown in FIG. 1, the components 1 for forming the coaxial cable or metal capacitor include three layers generally aligned as indicated by arrows A, B, and C and separated by separation areas as indicated by arrows S1 and S2. In an embodiment of the present invention, the layers include conductive and nonconductive components and the separation areas include nonconductive components. To form the coaxial cable or metal capacitor, an energy source, such as laser pulses are directed at the components via, for example, a laser 2.

Figure 2:
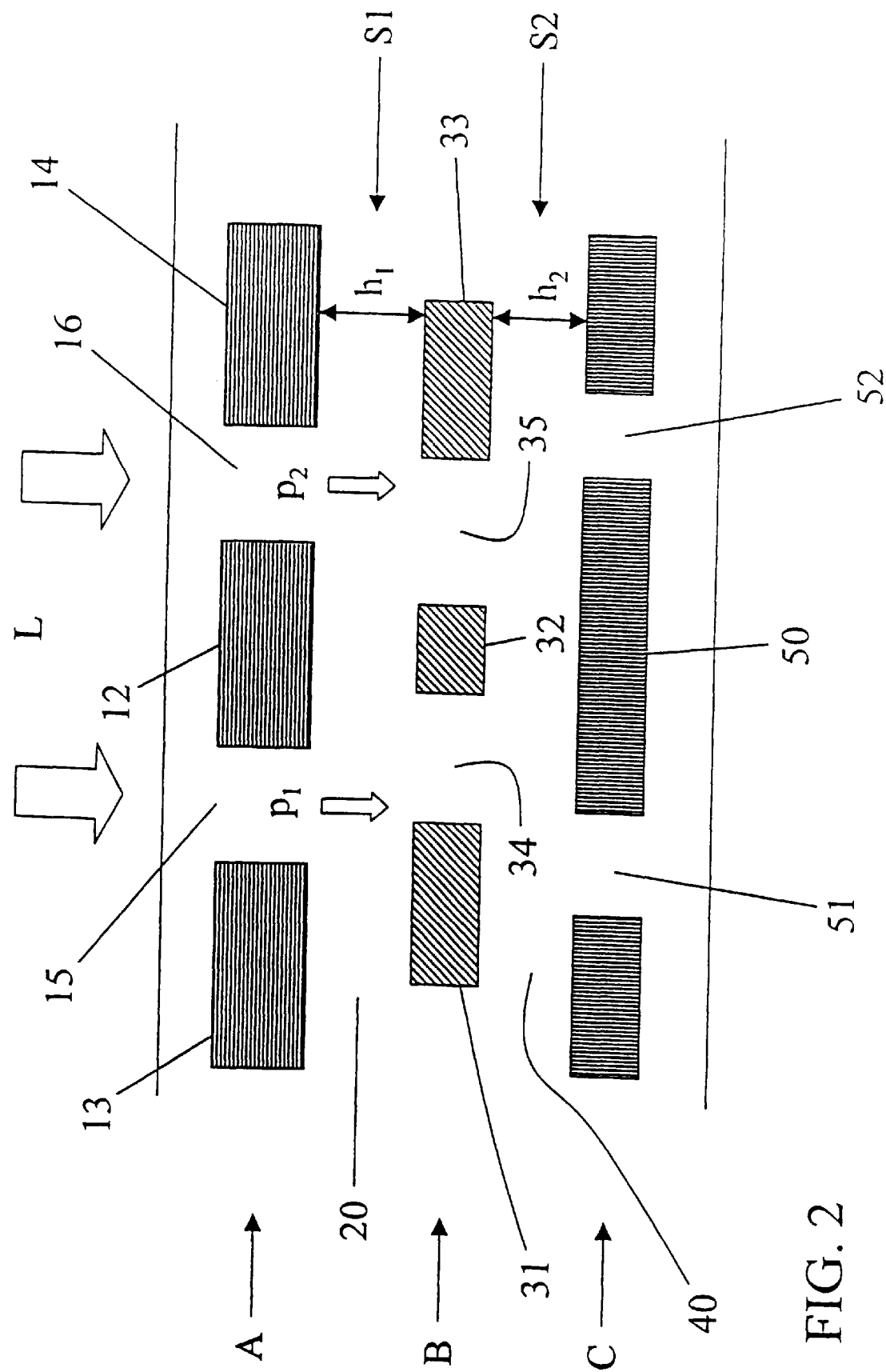
FIG. 2 shows a cross-sectional view of the components for formation of a coaxial cable or metal capacitor for the embodiment of FIG. 1.

FIG. 2 shows a cross-sectional view of the components for formation of a coaxial cable or metal capacitor for the embodiment of FIG. 1. As shown in FIG. 2, the layer aligned with arrow A includes a conductive component 12 and conductive or reflective components 13, 14. The components 12, 13 are separated by nonconductive material 15 and the components 12, 14 are separated by nonconductive material 16. The separation area S1 includes nonconductive material 20 of height $h_1$.

The layer aligned with arrow B includes conductive material 31, 32, 33 separated by nonconductive material 34, 35. The separation area S2 includes nonconductive material 40 of height $h_2$. The layer aligned with arrow C includes conductive material 50 and nonconductive material 51, 52.

In an embodiment of the present invention, to form the coaxial cable or metal capacitor, a source of energy producing directable energy, such as laser pulses produced by a laser, are directed toward the components as indicted by arrows L. The energy penetrates the components, transmitting energy to the components. In particular, conductive components impacted by the energy absorb the energy, become, for example, heated or melt, and thereby expand. Nonconductive components are less directly impacted by the transmitted energy, with energy generally being at least partially transmitted through the nonconductive components, as indicated by arrows $p_1$ and $p_2$.

Because of the direction of the energy L toward the components, as shown in FIG. 2, some of the conductive components are partially or wholly shielded from the energy by other conductive components. For example, in FIG. 2, conductive component 12 wholly shields conductive component 32 from the directed energy L. Conductive component 13 partially shields conductive component 31 from the directed energy L. Conductive component 14 partially shields conductive component 33 from the directed energy L.

As the conductive components absorb energy and become heated and expand, the nonconductive material surrounding the conducting components fractures, with some fractures connecting or linking the conductive components. Upon the heated conductive components further expanding and, for example, melting, the melted portions connect the conductive components via the fissures connecting these components.

Figure 3:
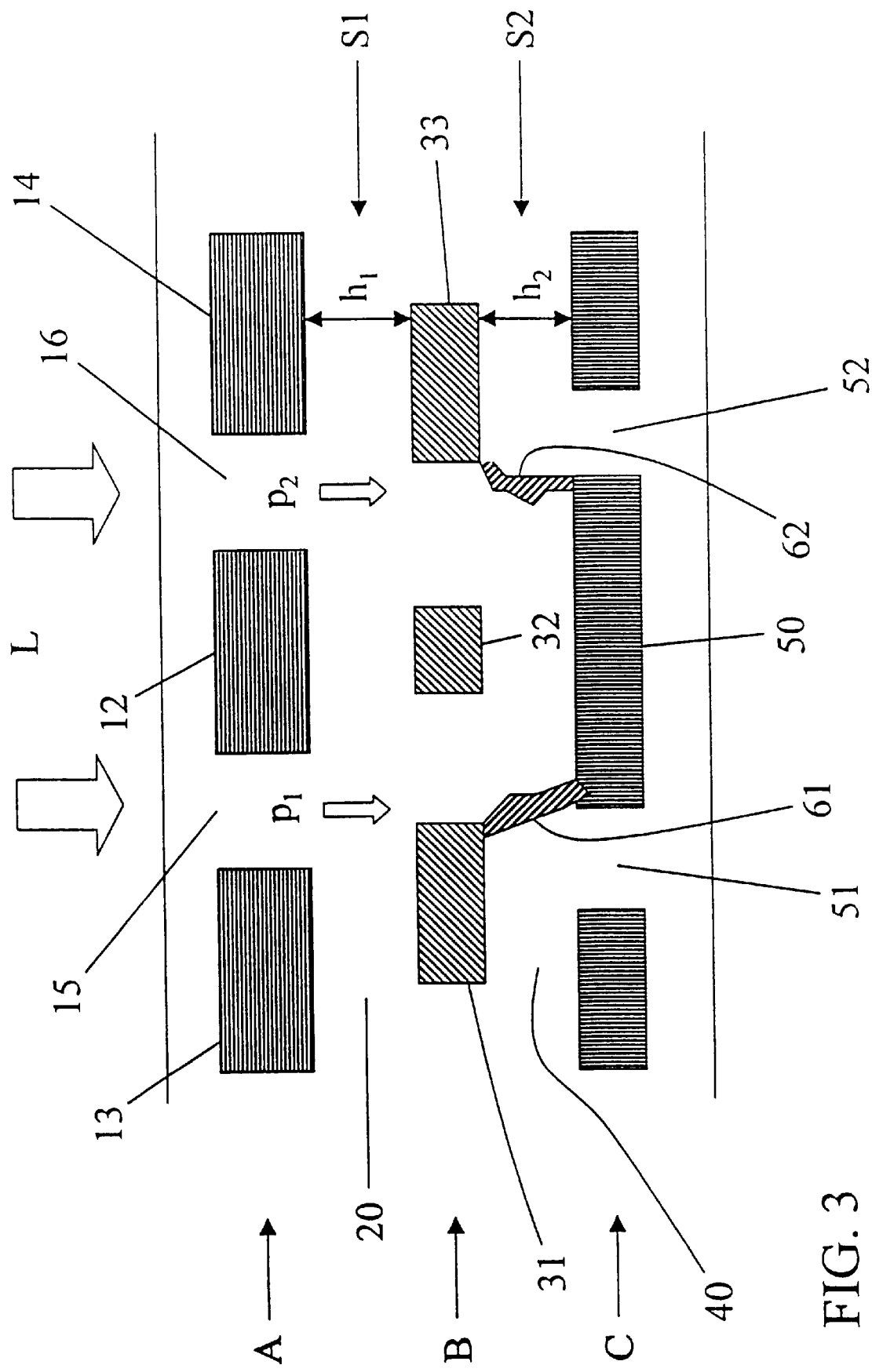
FIG. 3 is a cross-section view of a partially formed coaxial cable or metal capacitor during application of energy from a directed source, in accordance with an embodiment of the present invention.

FIG. 3 is a cross-section view of a partially formed coaxial cable or metal capacitor during application of energy from a directed source, in accordance with an embodiment of the present invention. As shown in FIG. 3, in accordance with embodiments of the present invention, methods are used to ensure that the connection between component 50 and components 31, 33 occur following exposure of the components to the energy source, and that other connections between components develop. In one embodiment, the connections between component 50 and components 31, 33 occur before connections among other elements occur.

The methods to ensure formation of connections among multiple levels include one or more of the following: 1) arranging or construction the components such that the nonconductive area 40, having a height $h_2$ less than the height $h_1$ of nonconductive area 20, such that fissures form and connections or links occur between component 50 and components 31, 33 and links occur between components 31, 33 and component 12; 2) arranging the components such that a larger area of component 50 is exposed to (not shielded from) the incident (impinging) energy than the components 31, 33, such that the component 50 heats and expands at a greater rate than the components 31, 33 and, as a result, connections form between component 50 and components 31, 33, before connections form between components 31, 33 and component 12; 3) directing the energy, such as in pulses, so that an initial pulse is directed first to the component 50 and subsequent pulses are directed at components 31, 33, and, as a result, connections or links form between component 50 and components 31, 33 prior to connections forming between components 31, 33 and component 12; 4) employing a metal or other conducting substance for component 50 having a lower melting point than the metal or other conducting substance comprising components 31, 33, such that the component 50 expands and melts to form connections with components 31, 33 prior to components 31, 33 expanding and melting to form connections with component 12; and 5) depositing an antireflective coating only on the surface of the component 50 or in greater amounts thereon than on components 31, 33, such that the antireflective coating ensures more absorption or more rapid absorption of energy by component 50 than components 31, 33, thus resulting in component 50 forming connections with components 31, 33 before components 31, 33 form connections with component 12. Alternatively, a component that enhances energy absorption may be used so that energy absorption is enhanced in selected components.

Figure 4:
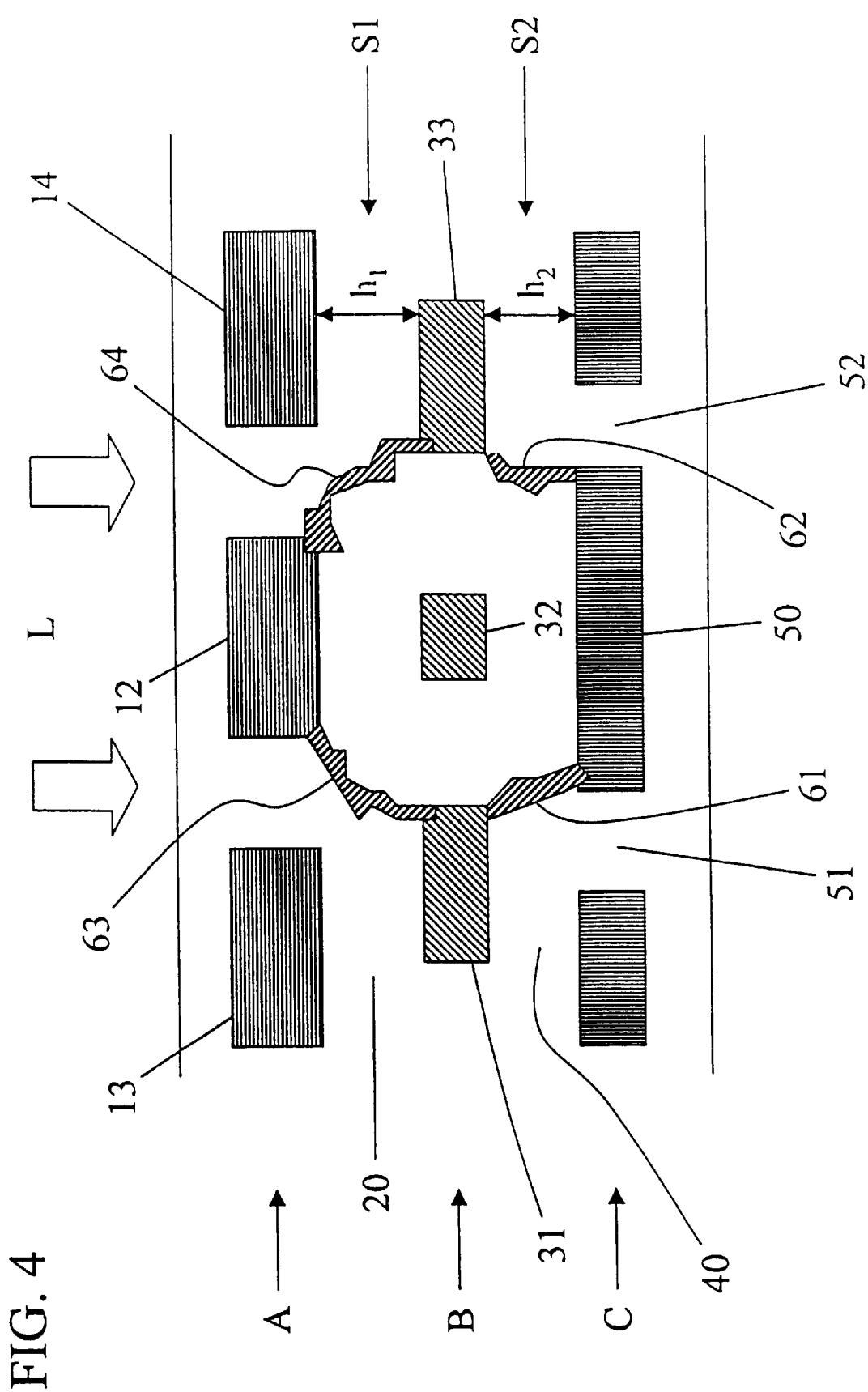
FIG. 4 presents a cross-sectional view of the formed coaxial cable or metal capacitor following application of energy from a directed source, in accordance with an embodiment of the present invention.

FIG. 4 presents a cross-sectional view of the formed coaxial cable or metal capacitor following application of energy from a directed source, in accordance with an embodiment of the present invention. As shown in FIG. 4, links or connections 61, 62, 63, 64 form among or between components 12, 31, 50, 33.

Figure 5:
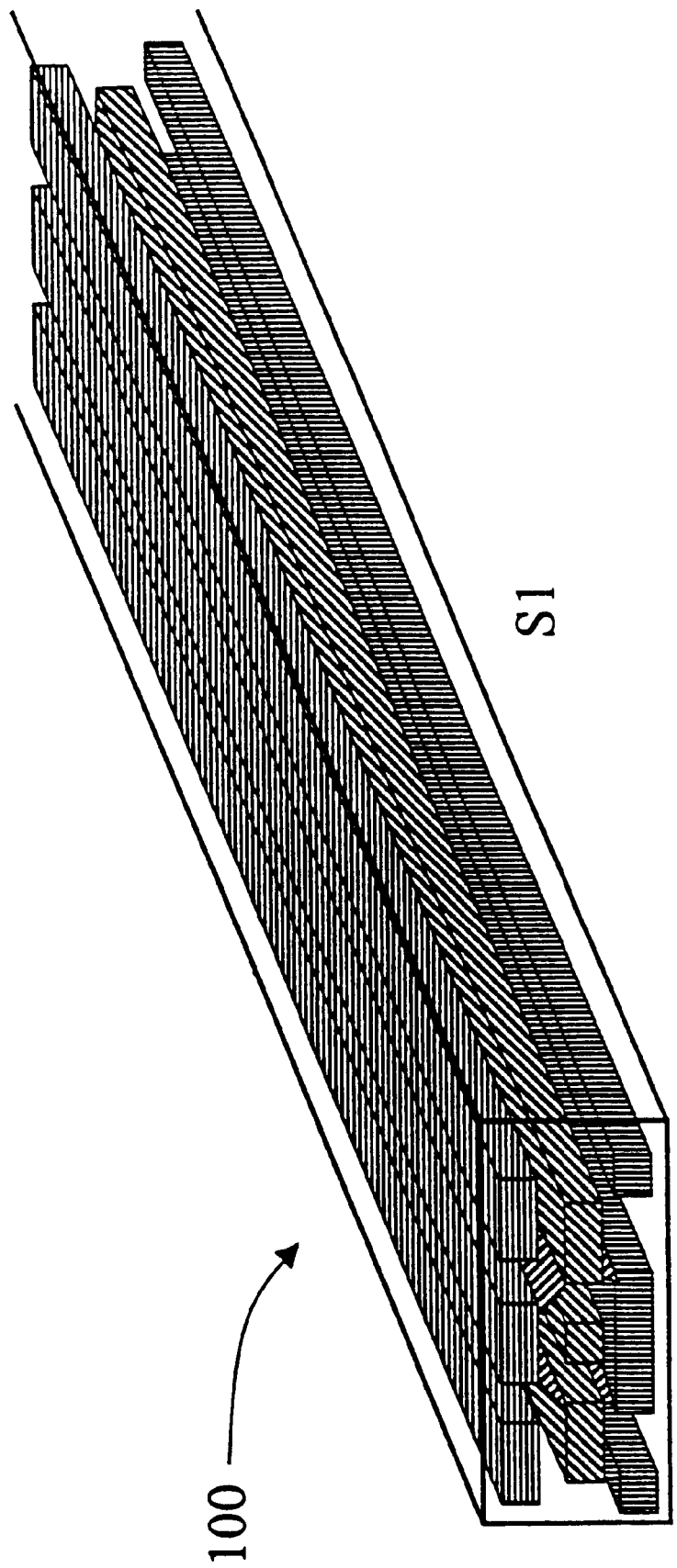
FIG. 5 is a perspective view of the formed coaxial cable or metal capacitor for the embodiment shown in FIG. 3.

FIG. 5 is a perspective view of the formed coaxial cable or metal capacitor 100 for the embodiment shown in FIG. 3.

Figure 6:
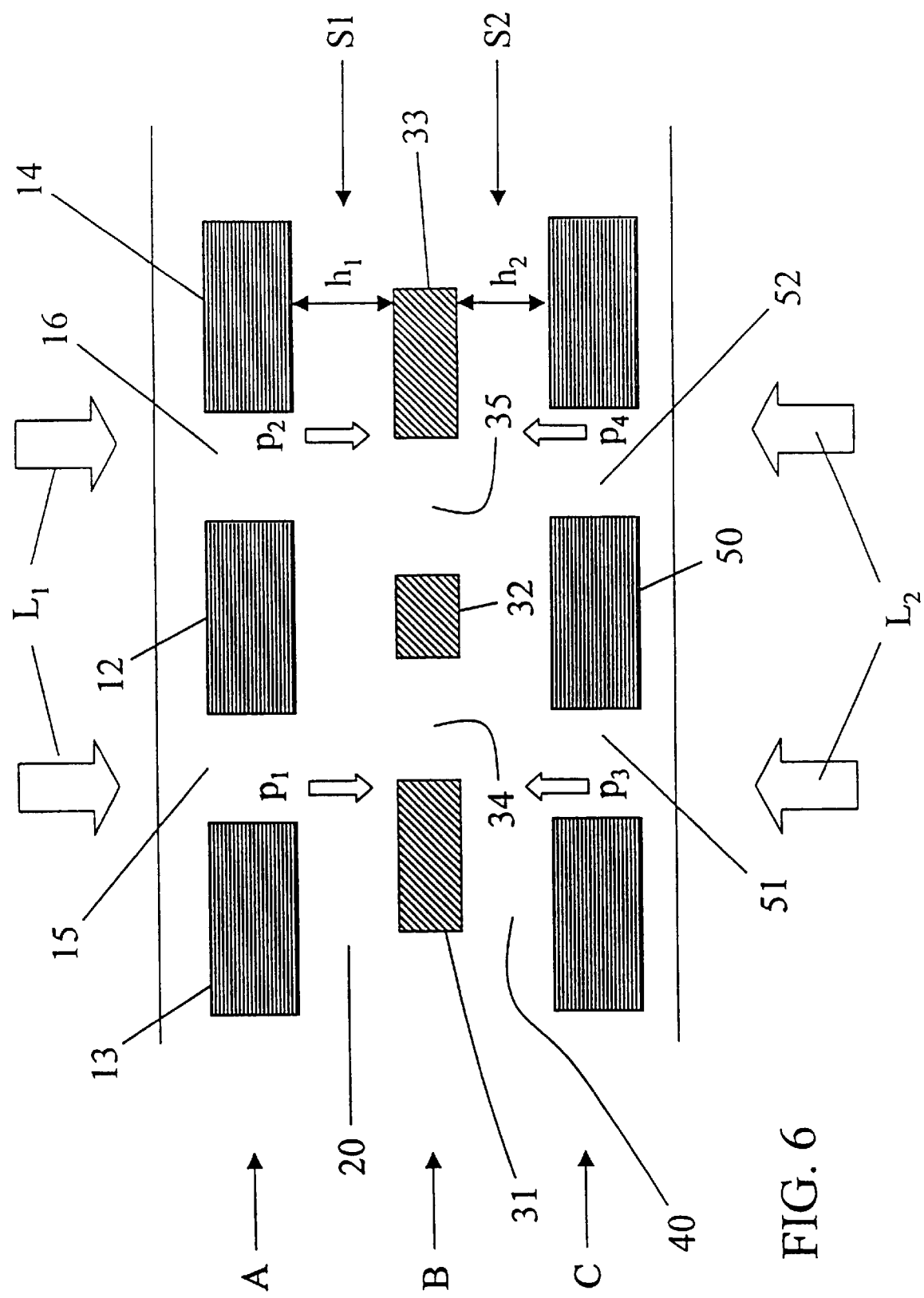
FIG. 6 presents a cross-sectional view of the components for formation of a coaxial cable or metal capacitor using two generated energy sources in accordance with an embodiment of the present invention.

FIG. 6 presents a cross-sectional view of the components for formation of a coaxial cable or metal capacitor using two generated energy sources in accordance with an embodiment of the present invention. The embodiment of FIG. 6 contains similar components 1 to the embodiment of FIGS. 1–5, except, in one embodiment, the components indicated by arrow C are very similar or identical in size and layout to those indicated by arrow A. In addition, instead of using the single directed source of energy L, as in FIGS. 1–5, the embodiment of FIG. 6 employs two directed sources of energy $L_1$, $L_2$, which result in transmitted energy indicated by the arrows $p_1$, $p_2$, $p_3$, $p_4$. The two directed sources of energy $L_1$, $L_2$ are produceable by a number of methods and systems, such as by multiple sets of laser pulses from a single laser that is moved relative to the components 1, or multiple laser pulses from multiple lasers. For example, in one embodiment, the components 1 are formed within an electronic device, the components 1 are then moved relative to a fixed laser, so that pulsed energy $L_1$, $L_2$ are directed at the components to produce transmitted energy indicated by the arrows $p_1$, $p_2$, $p_3$, $p_4$.

Figure 7:
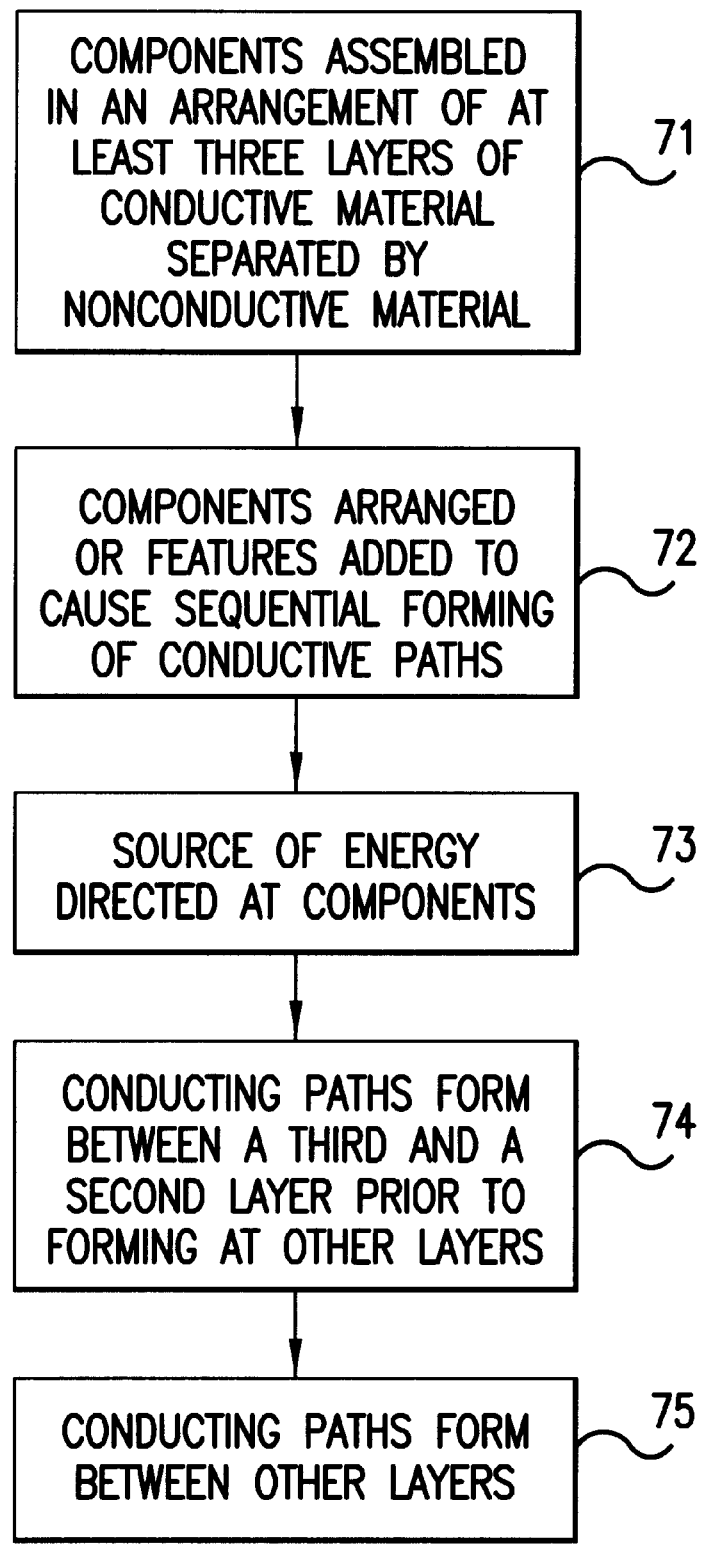
FIG. 7 is a flow diagram of functions performed in forming an integrated coaxial line or metal capacitor, in accordance with embodiments of the present invention.

FIG. 7 is a flow diagram of functions performed in forming an integrated coaxial line or metal capacitor, in accordance one embodiment of the present invention. As shown in FIG. 7, components are assembled to form at least three layers of conductive materials separated by nonconductive material 71. The components are further arranged or features or substances are added so as to cause forming of conductive paths 72. These further arrangements of features or substances include: 1) providing a larger relative area of a third metal layer is exposed to laser irradiation or other energy transfer than that of a second layer; 2) providing a diffusion barrier or other substance is located between the third layer and the energy source to reduce the amount of reflected light and allow relatively more heat absorption; 3) arranging the conductors such that a shorter relative distance exists between the third conductive layer and the second conductive layer compared to the distance between the second conductive layer and the first conductive layer, enabling sufficient energy to melt or otherwise cause formation of conductive links between the third and second layers prior to formation of links between the second and first layers; 4) employing a metal or other conducting substance having a lower melting point for some of the conductors to encourage formation of links with these conductors first; 5) directing the energy, such as in pulses, so that the energy is transmitted at or to conductors in a particular order or in selected patterns; and 6) combinations of these methods.

A source of energy, such as pulses from a laser, are directed at the components 73. In a first embodiment, the direction of the pulses is such that sequential or somewhat sequential formation of conducting paths is enhanced. In this embodiment, conducting paths form between a third and second layer (e.g., the layer most distant from the source of directed energy), prior to conducting paths forming between other layers 74. In a second embodiment, conducting paths are formed among the layers by multiple directional pulses of energy. In the first embodiment, following formation of the conducting paths between the third and second layers, formation of conducting paths among other layers occurs 75.

Example embodiments of the present invention have now been described in accordance with the above advantages. It will be appreciated that these examples are merely illustrative of the invention. Many variations and modifications will be apparent to those skilled in the art.

What is claimed is:

1. A method for forming a shielded conducting structure, comprising:

directing at least one directable source of energy at a plurality of components, the plurality of components including at least a first layer, a second layer, and a third layer, wherein each of the layers includes conducting and nonconducting portions, wherein at least one of the conducting portions in at least one of the layers is shielded from the at least one directable source of energy by at least a second conducting portion in at least one of the layers when the at least one directable source of energy is directed at the plurality of components, and wherein the at least one directable source of energy is directed so as to impinge the layers sequentially;

at least one of the conducting portions in the third layer expandably forming first conductive paths with at least two of the conducting portions in the second layer upon the at least one directable source of energy being directed thereat, wherein at least one of the conducting portions in the third layer expandably forming first conducting paths to at least two of the conducting portions in the second layer includes:
   the conducting portions expanding;
   the nonconducting portions fracturing to produce at least a first fracture connecting the at least one of the conducting portions in the third layer to one of the at least two of the conducting portions in the second layer and at least a second fracture connecting the at least one of the conducting portions in the third layer to a second one of the at least two of the conducting portions in the second layer; and
   the conducting portions expanding into the at least a first fracture and the at least a second fracture such that the at least one of the conducting portions in the third layer is connected to the at least two of the conducting portions in the second layer; and the at least two of the conducting portions in the second layer expandably forming second conductive paths to the at least one of the conducting portions in the first layer upon the at least one directable source of energy being directed thereat;

wherein the first and second conductive paths enclosably surround the at least one shielded conducting portion.

2. The method of claim 1, wherein, following forming of the first and second conductive paths, the nonconducting material forms a barrier between the linked conducting portions and the at least one shielded portion.

3. The method of claim 2, wherein the nonconducting portion comprises a dielectric material.

4. The method of claim 1, wherein directing the at least one directable source of energy at the plurality of components further comprises:

directing a first one of the at least one directable source of energy at the plurality of components such that the first layer is impinged first and the second layer is impinged second; and directing a second one of the at least one directable source of energy at the plurality of components such that the third layer is impinged first and the second layer is impinged second.

5. The method of claim 4, wherein the at least one of the conducting portions in the third layer expandably forming the first conductive paths to at least two of the conducting portions in the second layer occurs prior to the at least two of the conducting portions of the second layer expandably forming the second conductive paths to the at least one of the conducting portions in the first layer.

6. The method of claim 5, wherein the at least one of the conducting portions in the third layer expandably forming the first conductive paths to at least two of the conducting portions in the second layer occurring prior to the at least two of the conducting portions of the second layer expandably forming the second conductive paths to the at least one of the conducting portions in the first layer occurs due to increased energy absorption of the at least one of the conducting portions in the third layer.

7. The method of claim 6, wherein the at least one of the conducting portions in the third layer have a third layer conducting surface area exposed to the at least one directable source of energy, wherein the at least two of the conducting portions in the second layer have a second layer conducting surface area exposed to the at least one directable source of energy, wherein the at least one of the conducting portions in the first layer have a first layer conducting surface area exposed to the at least one directable source of energy;

and wherein the at least one of the conducting portions in the third layer expandably forms the first conductive paths to at least two of the conducting portions in the second layer prior to the at least two of the conducting portions of the second layer expandably forming the conductive paths to the at least one of the conducting portions in the first layer due to increased energy absorption of the at least one of the conducting portions in the third layer, the increased energy absorption of the at least one of the conducting portions in the third layer occurring due to the energy absorption area of the at least one conducting portions in the third layer being larger than the energy absorption area of the at least two conducting portions in the second layer.

8. The method of claim 4, wherein directing the at least one directable source of energy at the plurality of components further comprises:

first directing the at least one directable source of energy at the at least one of the conducting portions of the third layer; and then directing the at least one directable source of energy at the at least two of the conducting portions in the second layer;

such that the at least one of the conducting portions in the third layer expandably forms the first conductive paths to at least two of the conducting portions in the second layer prior to the at least two of the conducting portions of the second layer expandably forming the second conductive paths to the at least one of the conducting portions in the first layer.

9. The method of claim 4, wherein the at least one of the conducting portions in the third layer has a third layer conducting portion melting point, wherein the at least two of the conducting portions in the second layer have a second layer conducting portion melting point, wherein the at least one of the conducting portions in the third layer expandably forms the first conductive paths to at least two of the conducting portions in the second layer prior to the at least two of the conducting portions of the second layer expandably forming the second conductive paths to the at least one of the conducting portions in the first layer due to the second layer conducting portion melting point being greater than the third layer conducting portion melting point.

10. The method of claim 4, wherein the at least one conducting portions in the third layer has a surface area exposed to the at least one directable source of energy, the method further comprising:

prior to directing the at least one directable source of energy at the plurality of components, depositing a diffusion coating on the surface area of the at least one conducting portions in the third layer exposed to the at least one directable source of energy;

wherein the at least one of the conducting portions in the third layer expandably forms the first conductive paths to at least two of the conducting portions in the second layer prior to the at least two of the conducting portions of the second layer expandably forming the second conductive paths to the at least one of the conducting portions in the first layer due to increased relative energy absorption of the at least one of the conducting portions in the third layer resulting from the presence of the diffusion coating.

11. The method of claim 10, wherein the diffusion coating reduces the amount of reflected light and increases relative heat absorption of the coated portions.

12. The method of claim 11, wherein the diffusion coating is an antireflective coating.

13. The method of claim 4, wherein the first layer is separated from the second layer by a first separation distance, wherein the second layer is separated from the third layer by a second separation distance; and wherein the at least one of the conducting portions in the third layer expandably forms the first conductive paths to at least two of the conducting portions in the second layer prior to the at least two of the conducting portions of the second layer expandably forming the second conductive paths to the at least one of the conducting portions in the first layer due to the second separation distance being less than the first separation distance.

14. The method of claim 4, wherein the integrated coating structure comprises a coaxial cable.

15. The method of claim 4, wherein the integrated coating structure comprises a capacitor.

16. The method of claim 4, wherein the first and second conductive paths shield the at least one shielded conducting portion from electromagnetic interference.

17. The method of claim 4, wherein the first and second conductive paths include at least one opening.

18. The method of claim 4, wherein the first and second conductive paths include no openings.

19. The method of claim 4, wherein the at least one directable source of energy is a laser.

20. The method of claim 19, wherein directing the at least one directable source of energy at the plurality of components comprises:

directing a laser pulse at the plurality of components.

21. The method of claim 4, wherein the at least one directable source of energy is a laser, and wherein directing the at least one directable source of energy at the plurality of components comprises:

directing a first laser pulse at the at least one of the conducting portions of the third layer; and directing at least a second laser pulse at the at least two of the conducting portions in the second layer.

22. The method of claim 4, wherein the at least one directable source of energy impinges the layers sequentially, such that first the first layer is impinged, then the second layer is impinged, and lastly the third layer is impinged.

23. The method of claim 4, wherein directing the at least one directable source of energy at the plurality of components further comprises:

directing the at least one directable source of energy at the plurality of components such that the first layer is impinged first and the second layer is impinged second; and directing the at least one directable source of energy at the plurality of components such that the third layer is impinged first and the second layer is impinged second.

24. A shielded conducting structure, comprising:

first, second, and third conducting layers emplaced in a nonconducting material, the second conducting layer being located between the first and third conducting layers; wherein the first conducting layer comprises a first layer conducting element; wherein the second conducting layer comprises second layer first, second, and third conducting components, the second conducting component being located between the first and third conducting components; and wherein the third conducting layer comprises a third layer conducting component;

a first fracture in the nonconducting material, the first fracture containing first fracture conducting element, the first fracture connecting the first layer conducting element and the second layer first conducting component;

a second fracture in the nonconducting material, the second fracture containing second fracture conducting element, the second fracture connecting the first layer conducting element and the second layer third conducting element;

third fracture in the nonconducting material, the third fracture containing third fracture conducting element, the third fracture connecting the third layer conducting element and the second layer first conducting element; and a fourth fracture in the nonconducting material, the fourth fracture containing fourth fracture conducting element, the fourth fracture connecting the third layer conducting element and the second layer third conducting element.

25. A device for forming a shielded conducting structure, comprising:

a directed source of energy;

a first layer positionable for first receiving the directed source of energy, the first layer having a first layer conducting component and two first layer nonconductive regions adjacent the conducting component;

a second layer separated from the first layer by a nonconducting region, the second layer including three conducting components separated by two nonconductive regions, wherein the three conducting components of the second layer include a second layer first conducting component, a second layer second conducting component, and a second layer third conducting component, wherein the second layer second conducting component is located between the second layer first conducting component and the second layer third conducting component, wherein the second layer second conducting component is shielded from the source of energy by the first layer conducting component, and wherein the second layer first conducting component and the second layer third conducting component are at least partially unshielded from the source of energy;

a third layer separated from the second layer by a non-conducting region, the third layer including a third layer conducting component at least partially unshielded from the source of energy, the third layer conducting component extending such that the third layer conducting component is impactable by the source of energy via both of the two nonconducting regions of the second layer; and fractures in the nonconducting components, the fractures containing conducting component, the fractures connecting at least the first layer conducting component to the second layer first and second conducting components, and the fractures connecting the second layer first and second conducting components to the third layer conducting component.

* * * * *